United States Patent [19]
Leifer

[11] Patent Number: 5,986,454
[45] Date of Patent: Nov. 16, 1999

[54] QUADRATURE ELLIPTICAL BIRDCAGE COIL FOR NMR

[75] Inventor: Mark Curtis Leifer, Fremont, Calif.

[73] Assignee: Varian, Inc., Palo Alto, Calif.

[21] Appl. No.: 08/823,295

[22] Filed: Mar. 21, 1997

[51] Int. Cl.$^6$ ...................................................... G01V 3/00
[52] U.S. Cl. ........................................ 324/318; 324/322
[58] Field of Search ........................... 324/318, 300–322

[56] References Cited

U.S. PATENT DOCUMENTS

| | | | |
|---|---|---|---|
| 4,751,464 | 6/1988 | Bridges | 324/318 |
| 5,321,360 | 6/1994 | Mansfield | 324/322 |
| 5,372,137 | 12/1994 | Wong et al. | 324/318 |
| 5,543,711 | 8/1996 | Srinivasan et al. | 324/318 |

OTHER PUBLICATIONS

Abstract by W.E. Bimson et al., entitled "An Elliptical Cross Section Birdcage Body Coil", published in *Book of Abstracts*, vol. 1, Society of Magnetic Resonance in Medicine, Eleventh Annual Scientific Meeting, Aug. 8–14, 1992, Berlin, Germany, p. 272.

Article by K. Forbes et al., entitled "An Analysis and Optimization of Elliptical RF Probes Used in Magnetic Resonance Imaging", published in *Measurement Science and Technology*, vol. 7, No. 9, Sep. 1996, pp. 1281–1290.

Abstract by R. Kurezewski et al., entitled "Design of Elliptically Shaped Quadrature Pediatric Body Coils", published in *Book of Abstracts*, vol. 2, Society of Magnetic Resonance in Medicine, Eleventh Annual Scientific Meeting, Aug. 8–14, 1992, Berlin Germany, pp. 4025.

Abstract by B.L. Beck et al., entitled "Linear and Quadrature Characteristics of an Elliptical Birdcage", Proceedings of the Society of magnetic Resonance, vol. 3, Second Meeting, Aug. 6–12, 1994, San Francisco, USA, p. 1111.

Abstract by K. Li et al., entitled "A Method to Create an Optimum Current Distribution and Homogenous $B_1$ Field in Elliptical Birdcage Coils", Proceedings of the International Society For Magnetic Resonance in Medicine, Fourth Scientific Meeting and Exhibition, Apr. 27, May 3, 1996, New York, USA, vol. 3, p. 1411.

Abstract by Casey Li and Michael Smith, entitled "Theoretical Calculations of the Optimum Current Distribution for an Elliptical Birdcage RF Coil", Proceedings of the Society of Magnetic Resonance in Medicine, vol. 3, Twelfth Annual Scientific Meeting, Aug. 14–20, 1993, New York, USA, p. 1342.

*Primary Examiner*—Christine Oda
*Assistant Examiner*—Tiffany A. Fetzner
*Attorney, Agent, or Firm*—Edward H. Berkowitz

[57] ABSTRACT

Angular and current distributions for an elliptical birdcage resonator are realized in a design that achieves constant electrical phase between adjacent legs of the coil. Equal peak currents in the driven legs of the orthogonal modes yields exact quadrature operation.

15 Claims, 10 Drawing Sheets

QUADRATURE ELLIPTICAL BIRDCAGE COIL FOR NMR

FIELD OF THE INVENTION

The invention is in the field of NMR instrumentation and relates particularly to coupling of an NMR transmitter/receiver to an object under study which object exhibits substantially elliptical cross section.

BACKGROUND OF THE INVENTION

The application of rf excitation to a sample and the pick up of resulting resonant signal is accomplished in a structure surrounding the sample which may be a helical coil, saddle coil, resonant cavity, or a bird cage resonator. The latter structure is the object of the present work, wherein it is desired to couple to a sample which is substantially ellptical in cross section. A bird cage coil is a ladder circuit which closes on itself wherein the current flow around the coil is distributed sinusoidally. As a tuned rf circuit, it is employed in nuclear magnetic resonance apparatus for either or both of the functions of rf excitation and signal detection.

The bird cage coil differs in essential matter from saddle coils, helices and likegeometries by its discrete structure. For the bird cage coil, it is required that the phase shift be discretely distributed around the circumference of the coil from zero to $2\pi$ (or $2\pi k$ where k is an integer). The phase shift of each element is quite frequency dependent and as a consequence, the bird cage coil is tuned at a discrete frequency to achieve the desired phase shift constraint.

The bird cage coil is particularly well suited to large volume samples as are routinely encountered with apparatus for medical imaging and in vivo analytic spectroscopy. Prior art birdcage coils are discussed by Hayes et al, J. Mag. Res., vol. 63, pp. 622–628 (1985).

The bird cage structure may be regarded as a periodic structure which closes on itself. Periodic elements of the structure produce phase shifts which must aggregate to some multiple of $2\pi$ when summed over the closed loop. Geometrically, the resonator has cylindrical symmetry and it is desired that the rf current in the axial direction along the periphery of the structure be proportional to $\sin k\theta$ and/or $\cos k\theta$ where $\theta$ is the azimuthal angle about the cylindrical axis. The mode k=1 produces the most uniform transverse magnetic fields, such as are commonly used in analytic NMR applications.

The imperfect coupling component between an object studied and the NMR transmitter/receiver limits the performance of the measurement in several ways. First, there is the limitation in the sensitivity of instrumental performance as the weak resonance signals are not coupled in to the receiver in degree sufficient to exceed the inherent noise. There is the limitation on signal to noise ratio which is a consequence of a non-optimum filling factor, e.g., where the object occupies less than the entire sensitive volume. There is also a loss in precision due to the inhomogeneity with which the rf magnetic field is distributed throughout the sensitive volume.

The coupling component takes the form of an inductive structure surrounding the object under study. Typically this may assume the form of a cavity (for extreme frequencies), or more commonly, solenoidal, saddle or birdcage geometry. The birdcage geometry is the subject of the present work wherein it is desired to utilize a birdcage geometry in elliptical cross section to better match the cross section of the human body for medical imaging purposes.

RF coils of elliptic birdcage cross section are known for use in medical imaging of the human head and body. See reported work by Binson, Martin, Griffiths and Edwards, Proc. SMRM, p.272 (1992); Li and Smith, Proc. SMRM, 1342 (1993); Kurczewski, Pavlovich, Stiedly and Rollins, Proc. SMRM, p. 4025 (1992); Li, et al, Proc. ISMRM, p.1411 (1996).

The Binson, et al work taught an arrangement of leg elements such that segments formed by the coil elements and the central axis of the elliptical cylinder (in the cross section thereof) comprise equal areas, the current being distributed among the several legs sinusoidally about the end rings of the coil.

Li and Smith studied the $B_1$ field obtainable from an elliptical coil having 16 elements (legs) equally spaced in perimeter distance increments on the periphery. For an ellipse of semi-major axis A and semi-minor axis B their approximate formula for the current density on the surface of the ellipse is given as $$J_c(\theta)=J_0 \cos(\theta)/(B^2 \cos^2(\theta)+A^2 \sin^2)$$

to produce a magnetic field substantially parallel to the minor axis.

Kurczewski, et al constructed an elliptic birdcage coil with legs spaced at equal angular increments.

The starting point for the present work is to obtain the continuous surface current distribution $K_z(\theta)$ on the surface of an elliptical cylinder, which current distribution will produce uniform and orthogonal magnetic fields for quadrature operation in the interior of the ellipsoid. The well known technique of conformal mapping can be employed to transform to the simpler case of cylindrical geometry. Next, a discrete current distribution is obtained, which yields the equivalent field distribution as for the continuous current case. The discrete currents are preferably supported on 4M legs (M, an integer) in order to effectuate quadrature operation. The discrete case is further constrained to the situation of equal peak amplitudes driving the orthogonal modes in order that passive quadrature hybrid combiners may be employed to produce equal power splitting between ports. By reciprocity, the analysis for excitation of the birdcage coil from an rf current source is essentially duplicated for the reception of signals induced on the coil from a sample within the coil. Throughout this work, the sample excitation function for the coil is understood to describe the parallel signal reception function.

In the present work, discrete legs are spaced unequally in the geometric sense on the elliptical perimeter and at equal angular intervals of electrical phase.

DETAILED DESCRIPTION OF THE DRAWINGS

FIG. 2b is the simplified transmission line corrsponding to FIG. 2a.

Figure 3A:
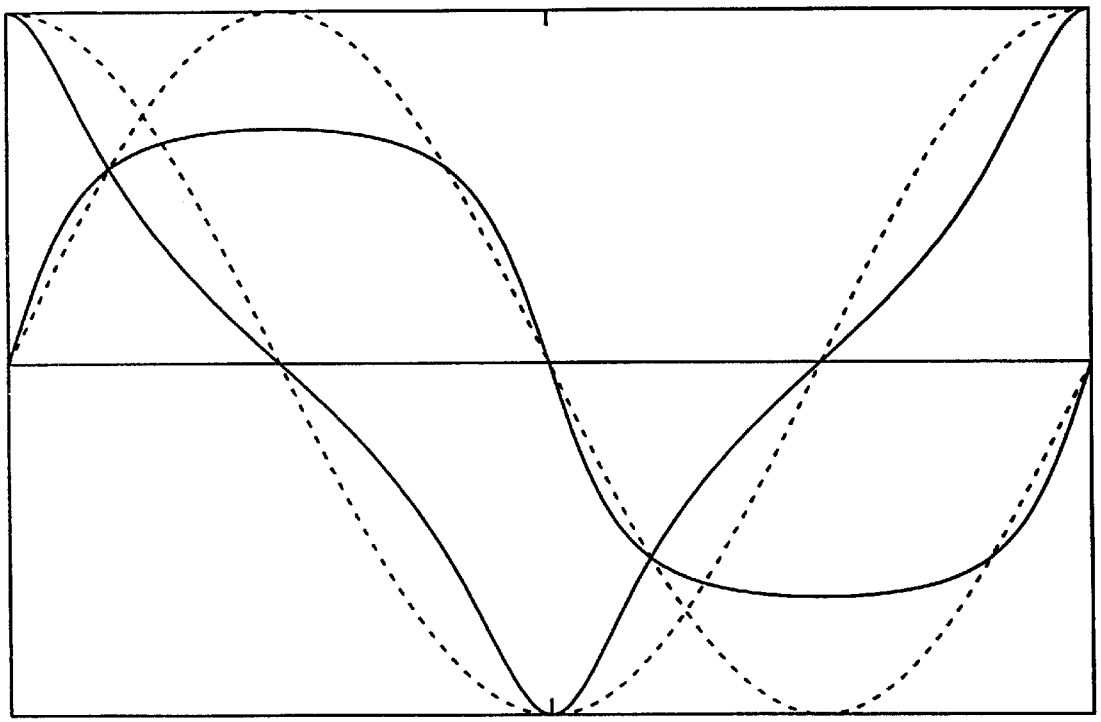

FIG. 3a displays the continuous current density of equation 1 for the two quadrature modes around the elliptical bound for a 3:2 ellipse with sine and cosine curves for comparison.

Figure 3B:
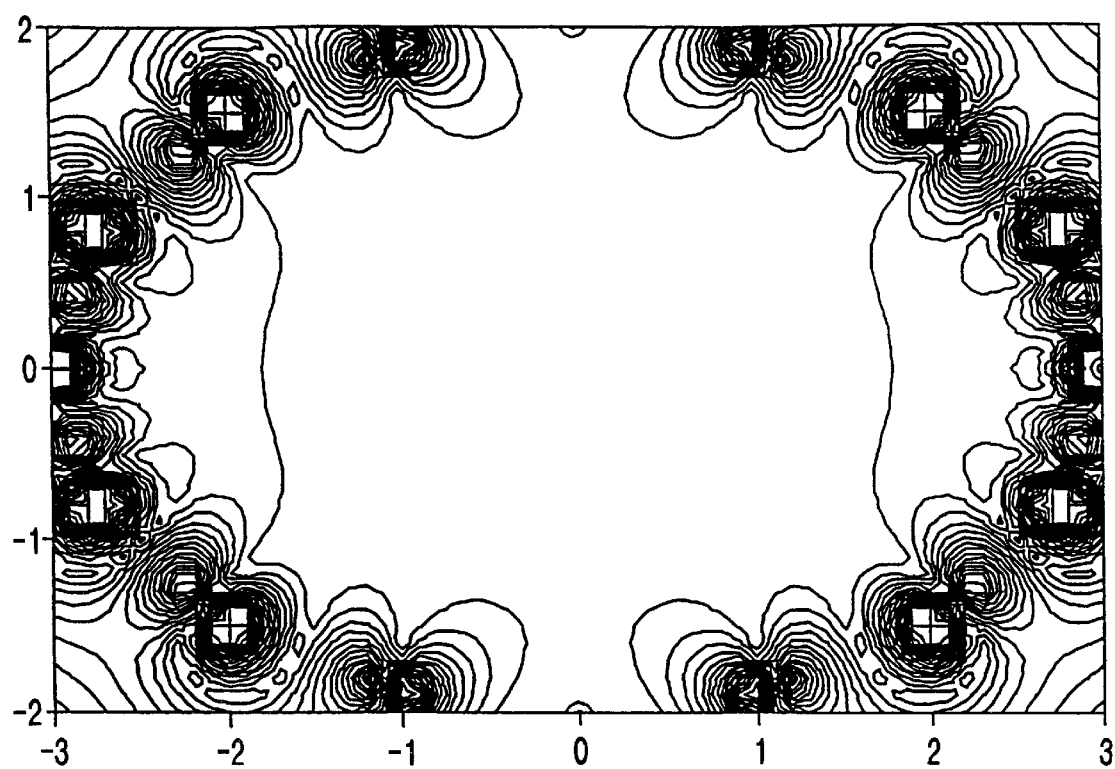

FIG. 3b displays computed (vertical) field homogeneity for a prior art 3:2 elliptical birdcage coil with cosinusoidal excitation.

Figure 3C:
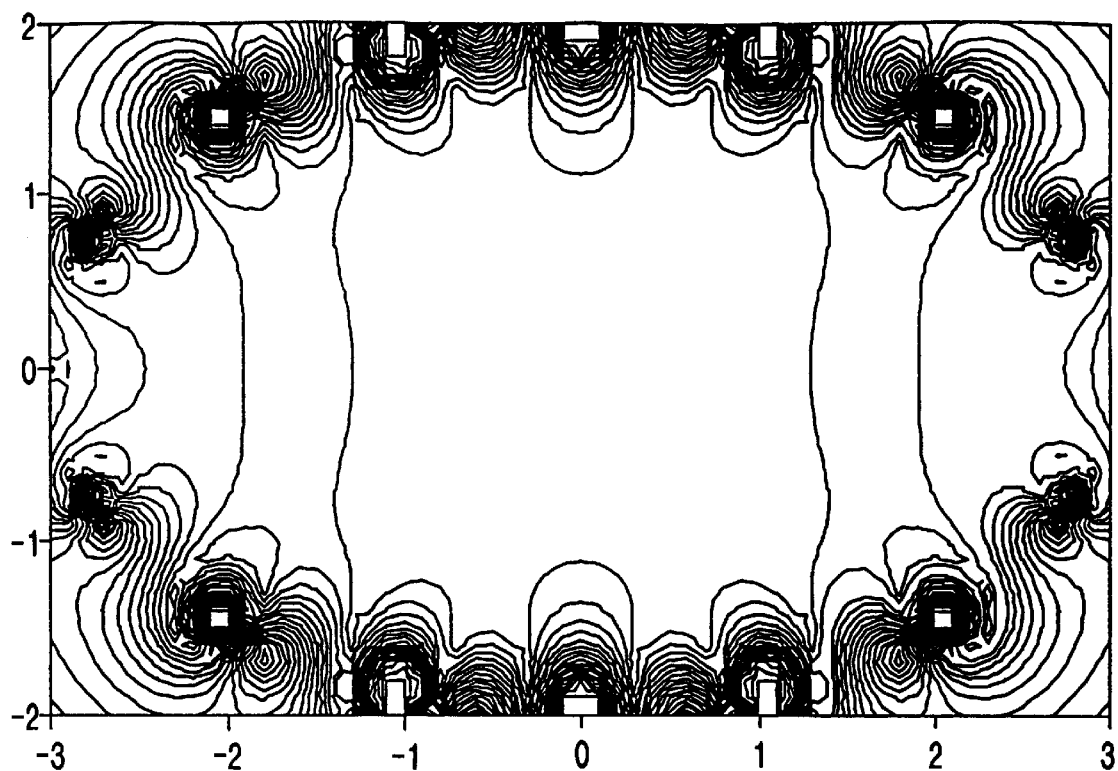

FIG. 3c displays computed (horizontal) field homogeneity for a prior art 3:2 elliptical birdcage coil with sinusoidal excitation.

Figure 4A:
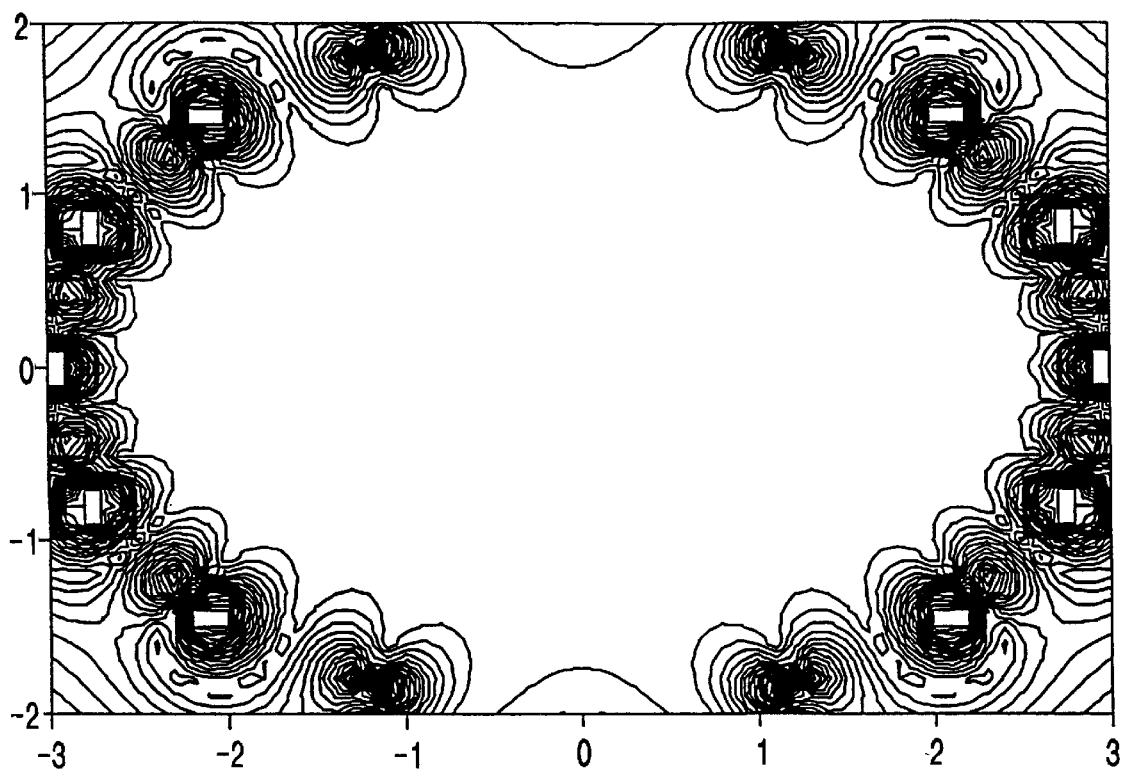

FIG. 4a shows the computed (vertical) field homogeneity for a 3:2 elliptical birdcage coil following the present invention.

Figure 4B:
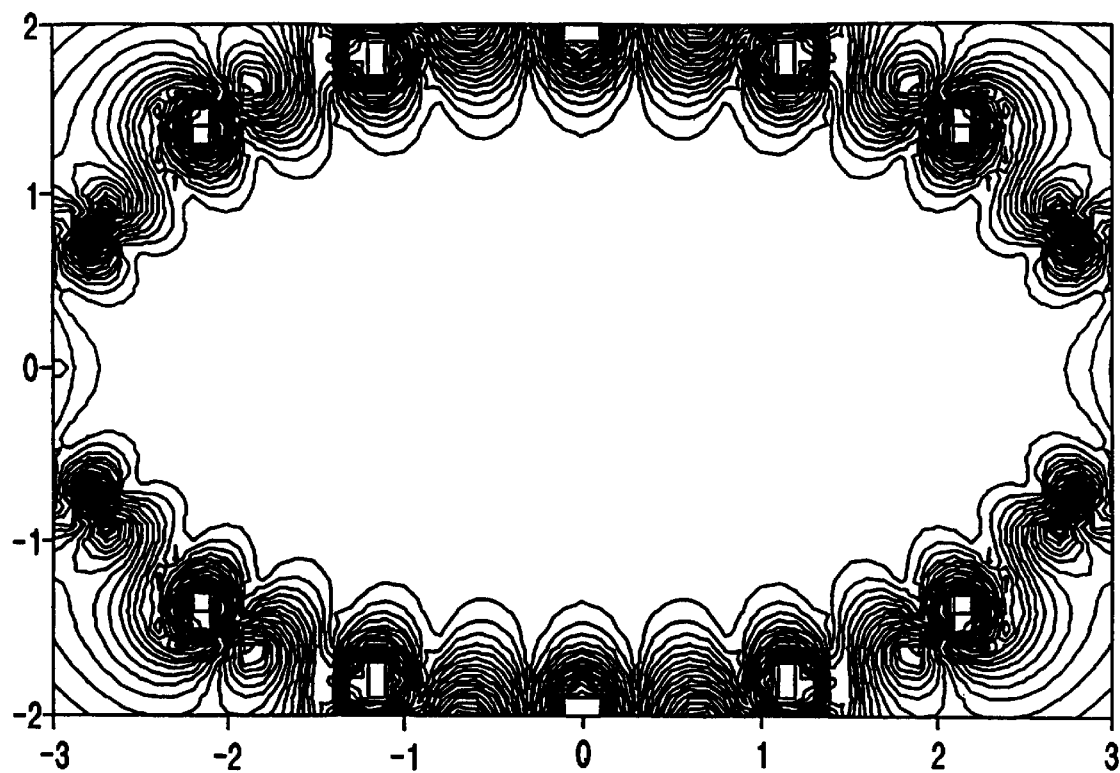

FIG. 4b shows the computed (horizontal) field homogeneity for a 3:2 elliptical birdcage coil following the present invention.

Figure 5:
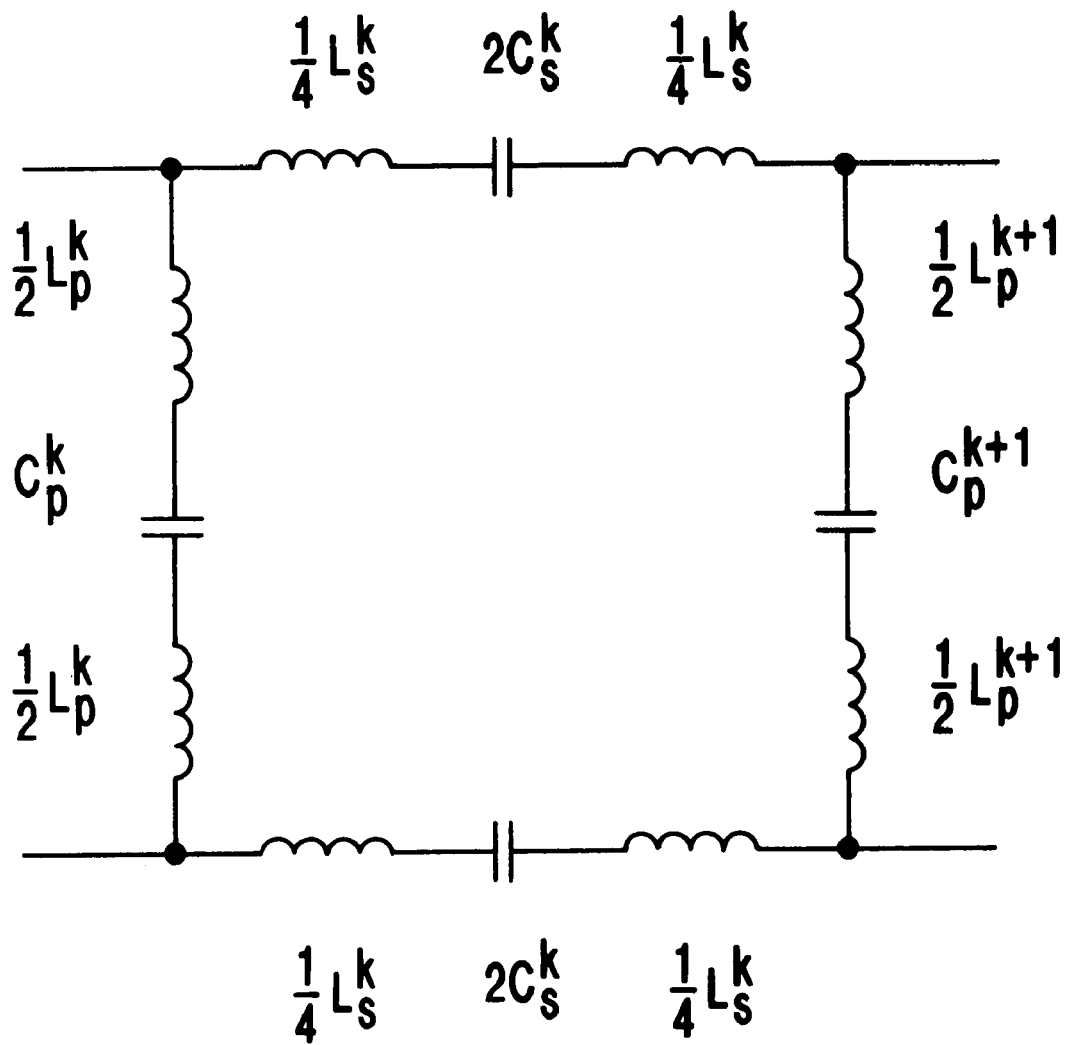

FIG. 5 shows a single mesh element of the elliptical birdcage coil of the invention.

Figure 6:
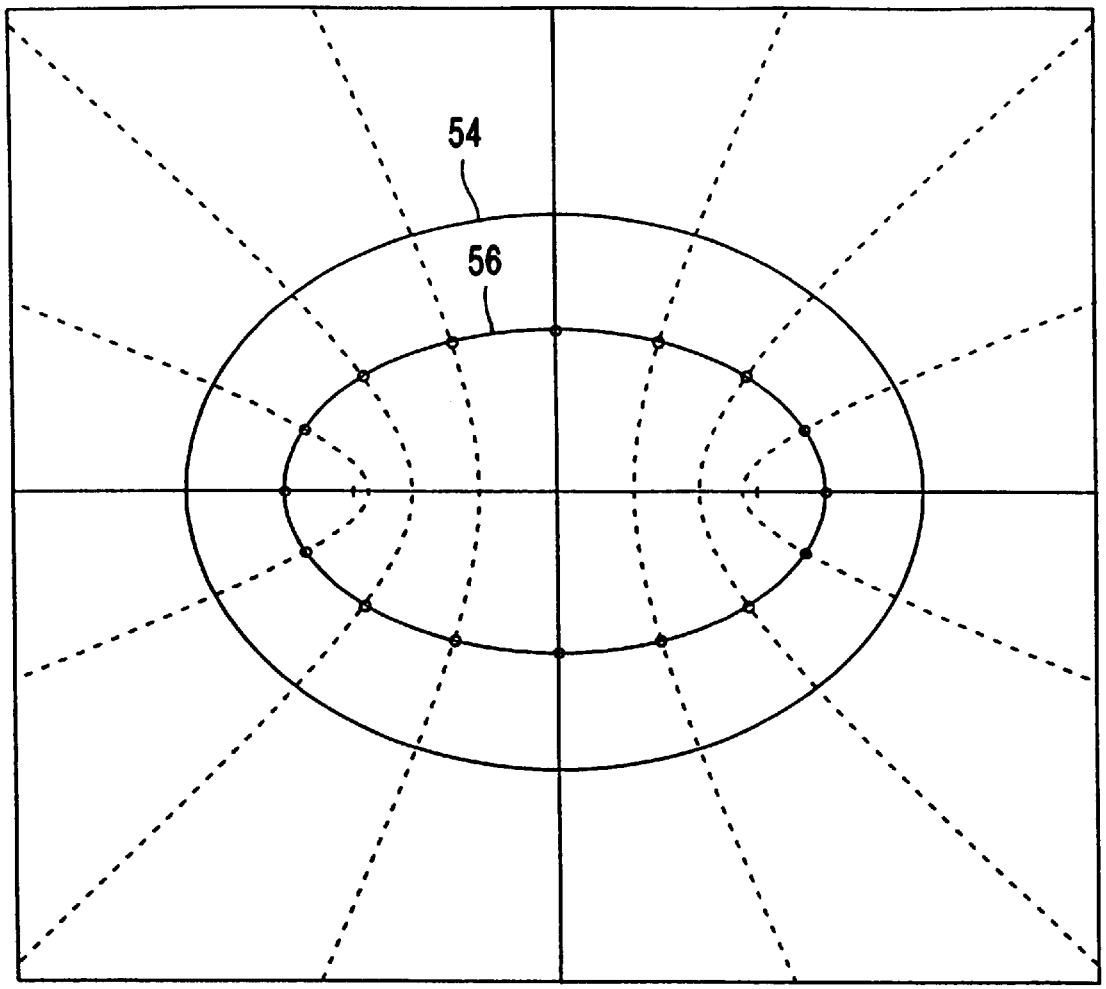

FIG. 6 shows the elliptical cross section coil with the preferred confocal shield.

Figure 7:
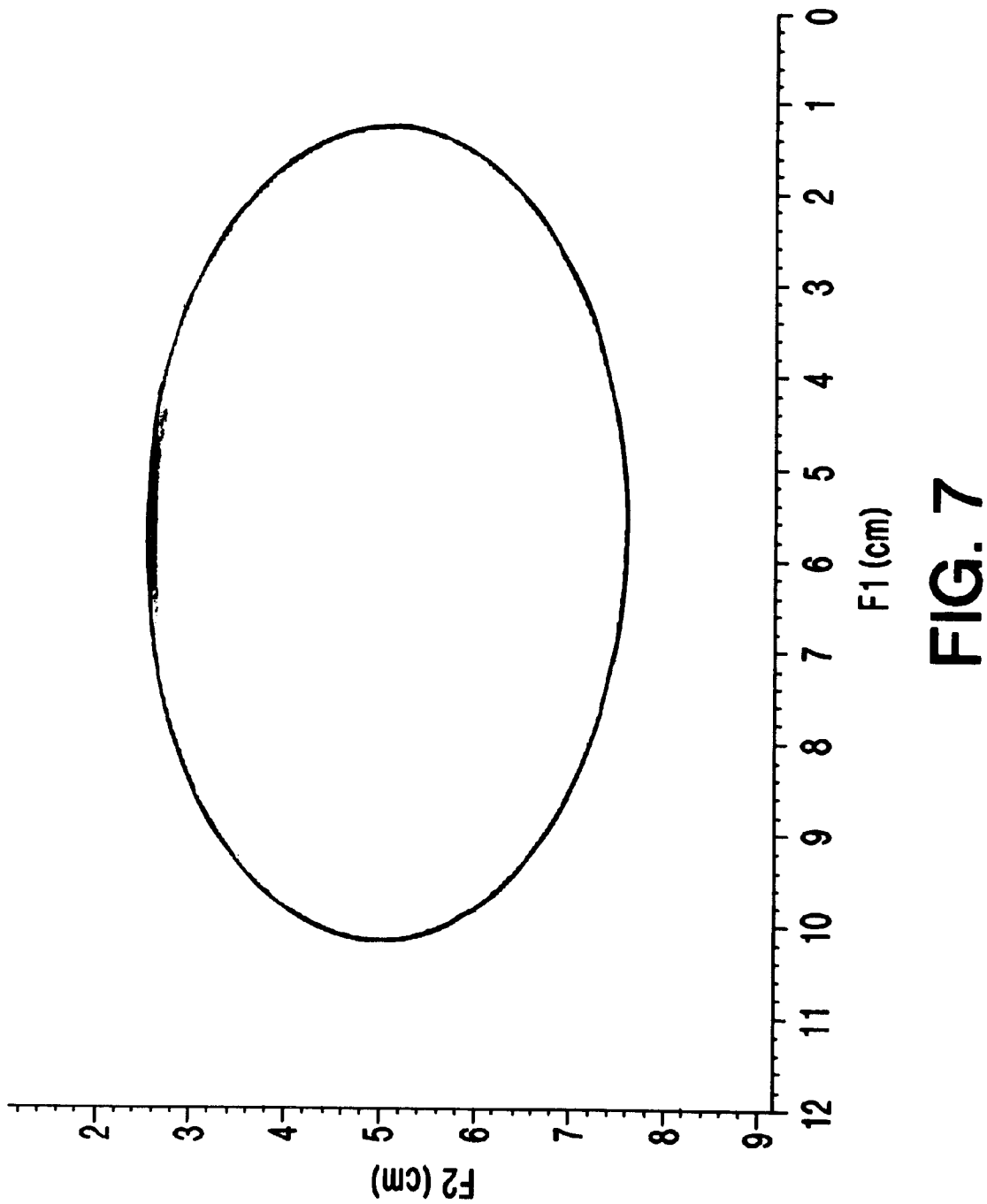

FIG. 7 shows an image of a uniform density phantom together with the image density distribution taken along a slice through the median plane of the phantom.

DETAILED DESCRIPTION OF THE APPARATUS

The physical context of the invention is an NMR apparatus. An idealized illustration is shown in FIG. 1.

A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other gradient coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by rf power, such that the rf magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

Figure 1:
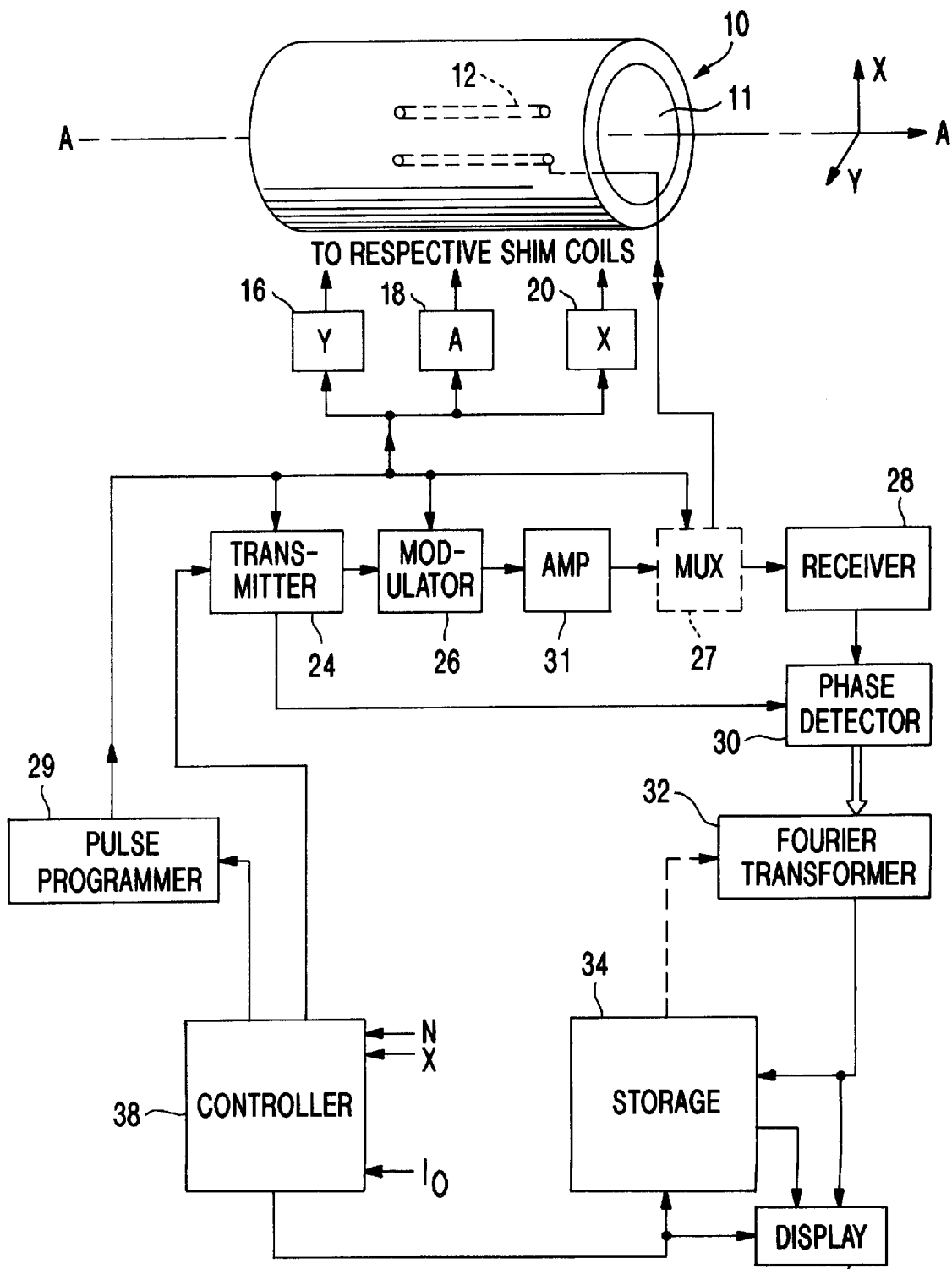
FIG. 1 is a schematic illustration of the context of the invention.

As shown in FIG. 1, rf power is provided from transmitter 24, modulated through modulator 26 to yield modulated pulses (amplitude or frequency or phase or combinations thereof) of the rf power which are amplified by amplifier 31 and thence directed via multiplexer 27 to the rf transmitter coil 12 located within bore 11. Transmitter and receiver coils are clearly not concurrently active as such. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide rf pulses of desired amplitude, duration and phase relative to the rf carrier at preselected time intervals. The pulse programmer may have hardware and/or software attributes. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

It is first desired to state the proper continuous current distribution around an elliptic cylinder which will produce uniform and orthogonal magnetic fields within the interior of the ellptic cylinder. It is understood that resonant modes corresponding to aggregate phase shifts of $2\pi k$ and possessing quadrupole, sextupole and higher order multipole field patterns for k=2, 3 . . . may be obtained and generated by following developments analogous to those given below for k=1. Attention is hereafter restricted to the k=1 mode which produce the substantially homogeneous fields most useful for magnetic resonance applications. While alternative techniques may be used to obtain the result, the results of Beth, (IEEE Trans. Nuc. Sci, vol. 14, pp.386–388, 1967) are straightforwardc. Consider an ellipse with semi-major axis m, semi-minor axis n, focii at $a=\{m^2-n^2\}^{1/2}$ and eccentricity e=a/m. The current density after transformation standard polar coordinates is obtained as $$K_z = B_1 e^{j\omega t}(m+n)/\mu_0(-j\ m\ \sin\theta + n\ \cos\theta)\{m^4 \sin^2\theta + n^4 \cos^2\theta\}^{-\frac{1}{2}}$$

Equ. 1 where $\theta$ is the geometric angle measured from the major axis and where the real parts of this expression denote the modes producing fields parallel to the major and minor axes respectively. An oscillatory excitation is applied at the resonance frequency $\omega$, and it is understood that the physical quantities are given by the real part of this expression and that of equ. 3. A 90° phase shift represented by $-j$ has been introduced between the sine and cosine modes to produce a circularly polarized field in the coil according to common practice for circular birdcage coils. The spatial variation is shown in FIG. 3a for an ellipse of aspect ratio 3:2 with sine and cosine curves provided for comparison.

The physical realization of the elliptic cylinder is obtained with discrete currents flowing in an array of N conducting legs. Therefore it is required to specify the angular positions over the ellipse on which the current carrying legs are disposed, and the currents which are supported thereon. Many discrete approximations to the continuous current model are possible. The choice is constrained by the requirement that the resonant structure support two modes in quadrature and produce substantially homogeneous transverse fields. For a circular quadrature driven birdcage coil, one requires N=4M conducting legs, equally spaced about the circumference of the structure, and further requires that equal peak drive currents for the two modes produce fields of equal magnitude. Mapping this uniform angular spacing of the circular birdcage coil to the elliptic surface results in non-uniform angular spacing for the legs at angles $$\theta_p = \tan^{-1}(n/m\ \tan\phi_p)$$  Equ. 2a $$\theta_p = 2\pi p/N + \phi_0$$  Equ. 2b where $\phi_p$ gives the electrical phase angle, p=0,1, 2, ... N–1 and N is an integer multiple of 4 to support quadrature operation. The offset angle $\phi_0=0$ places legs of the finished birdcage coil on the axes, while $\phi_0=\pi/N$ places windows at these locations. The first case is useful when electrical coupling to the leg(s) is employed and the second is useful when electrical coupling to the to the ring members is employed. Either arrangement is appropriate for inductive coupling. The practitioner will recognize the efficacy of other alternative coupling methods and different values of the offset angles. Thus the legs are not spaced equally in angle nor in increments of the perimeter distance about the ellipse in polar coordinates, but are uniformly distributed in electrical phase angle. Consider this system in elliptic cylindrical coordinates as shown in FIG. 6 and described by confocal ellipses and hyperbolae for specification of displacement and angular units u and v respectively. The elliptical coil is now described by u=ln b where b={(m+n)/(m−n)}$^{e,fra\ 1/2}$. It can be demonstrated that the electrical phase angle variable $\phi$ in the circular birdcage coil maps to the variable v on this ellipse. Thus, the legs are separated by equal phase intervals and are also spaced at equal intervals when viewed in the natural coordinates of the ellipse. This is illustrated in FIG. 6 where the legs on the ellipse are disposed at intersections with the hyperbolae v={0, $2\pi/N$ ... }. The spacing of the legs at uniform increments of phase angle is of major importance for linear as well as for quadrature operation.

By integration of equ. 1 over the phase angle $\phi_p-\pi/N$ to $\phi_p+\pi/N$, one obtains an expression for the current to be supported by the $p^{th}$ leg:

$$I_p=2Ce^{j\omega t}(m+n)\ \sin\pi/N(-j\ \sin\phi_p+\cos\phi_p) \quad \text{Equ. 3}$$

Note that the same peak current is described in each of the orthogonal modes.

It becomes necessary to provide an equal phase interval between legs in order to generate the desired current distribution about the ellipse. In a practical coil, legs of finite length are connected by reactive ring conductors to form a transmission line. Achieving equal phase intervals is equivalent to mapping the transmission line characteristics of the circular bird cage coil to the elliptic geometry. A circuit component transformation which effects this is easily derived.

A section of the elliptic transmission line appears in FIG. 5, with elements labeled with the mesh number p since they now vary with position around the ellipse, that is, the self-inductance of a mesh and its mutual inductance to another mesh depend on their indices. It is well-established that the behavior of a birdcage coil is dominated by mesh self-inductance and nearest-neighbor coupling, so equalizing these two terms around the ellipse with the addition of two sets of trim capacitors located in the rings and legs achieves the desired component transformation to within the commonly employed nearest-neighbor approximation. Capacitors are therefore shown in both ring and leg positions. Consider a low-pass birdcage structure with a leg centered on the x axis for specificity, although the invention is inclusive of, and the following discussion is readily extended to highpass, bandpass and bandstop forms. The flux coupling between neighboring meshes cannot be changed once the coil geometry is chosen, but their effective mutual inductance $M_{p,q}$ may be changed by altering the effective inductance $L_p$ of the shared leg. It may be shown that the mutual inductance changes twice as fast as the effective self inductance $dM_{p,q}=2dL_p$, so $M_{p,q}$ is made equal to the smallest coupling $M_{N-1,0}$ by the addition of a leg trim capacitor $$C2_p^{(trim)} = \frac{2}{\omega^2(M_{p,q} - M_{N-1,0})} \quad \text{Equ. [4]}$$

having small reactance. Although conceptually this capacitor is part of the leg inductance, physically it may be combined with the usual leg capacitor $C2_0$ to give the single leg capacitance $$C2_p = \frac{C2_0 C2_p^{(trim)}}{C2_0 + C2_p^{(trim)}}. \quad \text{Equ. [5]}$$

Turning to the mesh inductance, label the self-inductance of the pth mesh $M_{p,q}$ and note that the effective self-inductance $M_{0,0}$ of the smallest mesh is reduced by the presence of the trim capacitor in the leg shared with the p=1 mesh (there is no trim capacitor in the leg shared by the two smallest meshes), that is $$M_{0,0}^{(eff)} = M_{0,0} - \frac{1}{\omega^2 C2_1^{(trim)}}. \quad \text{Equ. [6]}$$

The self-inductance of the larger meshes can be reduced to $M_{0,0}^{(eff)}$ by the addition of trim capacitors C1 in each ring segment which are not normally present in a low-pass coil. The self-inductance of these meshes has also been reduced by their mutual-inductance trim capacitors to $$M_{p,p}^{(eff)} = M_{p,p} - \frac{C2_p^{(trim)} + C2_{p+1}^{(trim)}}{\omega^2 C2_p^{(trim)} C2_{p+1}^{(trim)}},$$

however, so the two ring trimmers need compensate only for the difference in effective inductance $$C1_p^{(trim)} = \frac{2}{\omega^2\left(M_{p,p}^{(eff)} - M_{0,0}^{(eff)}\right)}. \quad \text{Equ. [7]}$$

These equations complete the transformation. It is noted in passing that the idea of numerically computed ring trim capacitance for a high pass coil is known from prior art. Finally, it is noted that nearest neighbor coupling of adjacent meshes is dominated by the leg shared between the two meshes. Variations in nearest neighbor coupling are therefore small and may be ignored for ellipses of modest eccentricity, thereby eliminating the leg trim capacitor for these cases.

The prescriptions of the last three paragraphs transform the reactances of the lowpass elliptic coil to the nominal parameters $C2_0$, $M_{0,0}^{(eff)}$ and $M_{N-1,0}$ which define the equivalent circular birdcage within the framework of the nearest-neighbor approximation. For practical purposes, the elliptic birdcage has been transformed electrically to a circular one. Effects of the neglected variations in mesh coupling are very small perturbations of this circular coil. The electrical component transformations are consistent with the initial invention description: equalizing the effective component values around the ellipse makes the electrical phase shift between any adjacent legs constant, while $C2_0$ is that which makes the total phase shift around the perimeter equal to $2\pi$, Corresponding procedures and results obtain for the elliptic high- and bandpass coils.

Figure 2A:
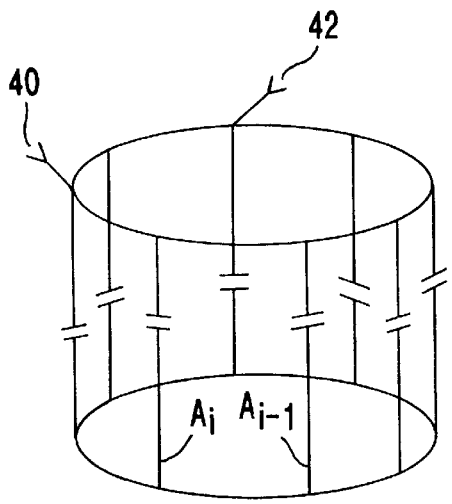
FIG. 2a is a schematic illlustration of a low pass elliptical birdcage coil adapted for quadrature operation.
Figure 2B:
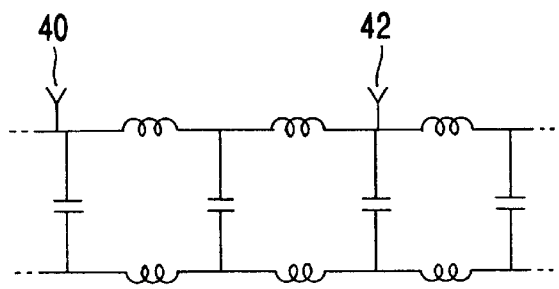
Figure 2D:
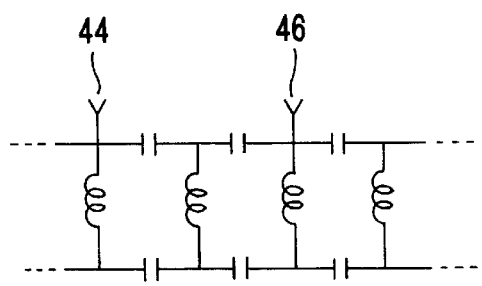
FIG. 2d is the simplified transmission line corresponding to FIG. 2c.
Figure 2C:
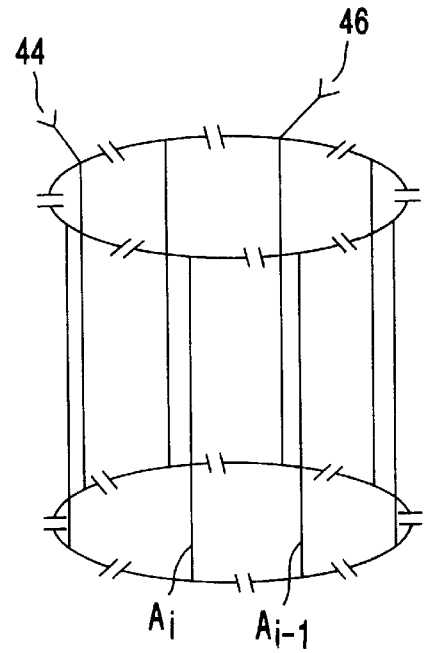
FIG. 2c is a schematic illustration of a high pass elliptical birdcage coil adapted for quadrature operation.

The specific subject matter of the present invention is a particular structure for the transmitter or receiver coil 11. Physically, a low pass bird cage coil of prior art may be identified with the perspective sketch of FIG. 2a and electrically, with the network of FIG. 2b. The paraxial extending, or longitudinal members $A_i$ are series LC components, the series inductance $L_2$ for which is generally distributed over the length of conductor, or longitudinal bar. Each adjacent pair of bars $A_i$ and $A_{i-1}$ are coupled to form a parallel array of the bars $A_i$ via annular coupling elements $B_i$ comprising the inductance of the coupling element. Exemplary coupling points 40, 42 and 44,46 are shown to suggest particular coupling arrangements. T rim capacitors, not shown, are discussed above.

For a lossless coil, equal peak magnitude currents flow in the driven leg of each quadrature mode.

FIGS. 3b and 3c are computed transverse field contour plots for therespective transverse orthogonal field modes (vertical and horizontal), normalized to the field strength at the center of a discrete 16 pole ellipse having aspect ratio m:n of 3:2 and having the prior art arrangement of coil legs at equal intervals of displacement along the periphery of the ellipse. In FIG. 3b the current distribution is cosinusoidal and in FIG. 3c the current distribution is sinusoidal. In each case the contour interval represents deviations of approximately 5% from the field strength normalized to the center of the figure.

FIG. 4a and 4b show the computed field contour plots corresponding to FIGS. 3b and 3c for the present invention, wherein the coil legs are disposed at equal intervals of electrical phase according to equ. 2a and 2b and the current distribution is given by equation 3. The improved homogeneity is evident.

The birdcage coil is ordinarily surrounded by a conductive shield. In FIG. 6 an elliptical shield 54, confocal with the elliptical cross section of the coil 56 is found to be theoretically advantageous in the sense that the multipole symmetry is best preserved. As a practical matter however, the perturbations which may be introduced by the presence of a shield of any geometry may be compensated using the method described above, to maintain the desired constant phase shift per section of transmission line.

Operational performance of the invention is shown in FIG. 7 wherein a uniform density phantom is imaged using the present quadrature driven birdcage coil in a conventional magnetic resonance imaging apparatus. The image amplitude distributed along a slice taken through the median plane of the phantom presents a substantially uniform profile. A grey scale indicator is included to the right of the image for rough estimation of the density. A slight imperfection in field homogeneity appearing at the top of the semi-minor axis is attributed to a change in the reactance of the leg situated at $\theta=\pi/2$ introduced when the operating frequency of the coil was increased slightly to the frequency of the imaging instrument. The axes are graduated in centimeters.

For the case of a conductive elliptic cylindrical sample enclosed within the elliptical birdcage, the uniform major- and minor-axis fields may be expected to be unequal for the two modes. This behaviour occurs, in fact, when a conductive elliptical cylindrical sample is placed inside any coil structure producing substantially uniform magnetic fields, including the circular birdcage coil.

The case of unequal loading by the orthogonal modes may be addressed in the embodiment by relative rotation of the exciting fields with respect to the sample. If, for example, the coil is driven by coupling the RF current to a driven leg and the number of legs is an integer multiple of 8, then driving the legs situated at 45° of electrical phase angle with respect to the major and minor axes of the ellipse can have the effect of equal loading of the two modes from an equal linear combination of the loading characterizing the sample. With this orientation, each mode will experience equal linear combination of horizontal and vertical loading. The appropriate field orientation may be otherwise acheived by rotation of the pattern of distribution of the legs as given above so that a leg resides at each of the desired driven points.

Although this invention has been described with reference to particular embodiments and examples, other modifications and variations will occur to those skilled in the art in view of the above teachings. It should be understood that within the scope of the appended claims, this invention may be practiced otherwise than as specifically described and many modifications are consistent with the scope of the claims. In the claims, means-plus -function clauses are intended to cover the structures defined herein as performing the recited function and not only structural equivalents, but also, equivalent structures.

What is claimed is:

1. An elliptical quadrature driven birdcage resonator comprising
   (a) N leg members disposed parallel to a common axis and and distributed on the periphery of an elliptical boundary surrounding said axis, N comprising a multiple of 4, said elliptical boundary having semi-major axis m and semi-minor axis n, said leg members disposed at an angle given for the $p^{th}$ leg member as $$\theta_p = \tan^{-1}\{(n/m) \tan\phi_p\}$$

and $\phi_p = 2\pi p/N + \phi_0$, and $\phi_0 = 0$ or $\pi/N$, the electrical phase angle between adjacent legs is a constant value, $2\pi/N$,
   (b) reactive elements coupling adjacent said leg members, said leg members and reactive elements forming a transmission line disposed on a surface lateral to said axis defined by said boundary,
   said reactive elements comprising an electrical current divider adapted to distribute an electrical current among each of said leg members so as to be carried by respective leg members in corresponding magnitude as $$I_p = Ce^{j\omega t}(m+n) \sin\pi/N(-\cos\phi_p + j \sin\phi_p)$$

and C is a constant, and
   (c) two said leg members having a phase angular difference of 90° therebetween adapted to communicate with respective RF current sources, said current sources of equal peak amplitude and in quadrature relationship.

2. Ihe elliptical quadrature driven birdcage resonator of claim 1 wherein said two leg members are substantially aligned with respective major and minor elliptical axes.

3. The elliptical quadrature driven birdcage resonator of claim 1 wherein said two leg members are substantially aligned at 45° of electrical phase angle with respective major and minor elliptical axes.

4. Ihe elliptical quadrature driven birdcage resonator of claim 1 wherein said two leg members communicate with said RF current sources through an inductive coupling to said current sources.

5. The elliptical quadrature driven birdcage resonator of claim 1 wherein said two leg members communicate with said RF current sources through a non-inductive coupling to said current sources.

6. The elliptical quadrature driven birdcage resonator of claim 1 wherein two said reactive elements communicate with said RF current sources through an inductive coupling to said current sources.

7. The elliptical quadrature driven birdcage resonator of claim 1 wherein two said reactive elements communicate with said RF current sources through a non-inductive coupling to said current sources.

8. An elliptical birdcage resonator comprising
   a) a plurality of leg members parallel to a common axis and and distributed on the periphery of an elliptical boundary surrounding said axis, said elliptical boundary having aspect ratio m/n,
   (b) reactive elements coupling adjacent said leg members, said leg members and reactive elements forming a transmission line disposed on a surface lateral to said axis defined by said boundary, each said leg capable of supporting an rf current having respective rf phase,
      said legs disposed with angular separation corresponding to a constant angular increment in phase angle of said rf current.

9. The elliptical birdcage resonator of claim 8 wherein said reactive elements comprise trim capacitors of selected value for achieving substantially equal electrical phase angle between adjacent legs.

10. The elliptical birdcage resonator of claim 8 wherein said leg members comprise trim capacitors of selected value for achieving substantially equal electrical phase angle between adjacent legs.

11. The elliptical birdcage resonator of claim 8 further comprising a conductive shield laterally surrounding said resonator and spaced apart therefrom.

12. The elliptical birdcage resonator of claim 8 wherein said conductive shield is confocal with said elliptical boundary.

13. A quadrature driven elliptical birdcage resonator comprising:
   a) a plurality of leg members parallel to a common axis and distributed on the periphery of an elliptical boundary surrounding said axis, said elliptical boundary having aspect ratio m/n, and a major and minor axis,
   b) reactive elements coupling adjacent said leg members, said leg members and reactive elements forming a transmission line disposed on a surface lateral to said axis defined by said boundary, each said leg capable of supporting an RF current having respective RF phase,
   c) a first and second of said legs disposed with angular separation of 90° of electrical phase therebetween and said first and second legs disposed at 45° of electrical phase angle with respect to said major and minor axis, and
   d) first and second RF current sources having respected phases of I and Q=I+90°, said first and second RF current sources communicating with respective first and second legs.

14. The elliptical bridcage resonator of claim 13 further comprising a conductive shield laterally surrounding said resonator and space apart therefrom.

15. The elliptical birdcage resonator of claim 13, wherein said conductive shield is confocal with said elliptical boundary.

* * * * *